(12) United States Patent
Shirai

(10) Patent No.: US 9,679,744 B2
(45) Date of Patent: Jun. 13, 2017

(54) CHARGED PARTICLE BEAM APPARATUS AND METHOD OF CORRECTING LANDING ANGLE OF CHARGED PARTICLE BEAM

(71) Applicant: Hitachi High-Technologies Corporation, Minato-ku, Tokyo (JP)

(72) Inventor: Masumi Shirai, Tokyo (JP)

(73) Assignee: Hitachi High-Technologies Corporation, Tokyo (JP)

(*) Notice: Subject to any disclaimer, the term of this patent is extended or adjusted under 35 U.S.C. 154(b) by 0 days.

(21) Appl. No.: 14/356,166

(22) PCT Filed: Nov. 6, 2012

(86) PCT No.: PCT/JP2012/078727
§ 371 (c)(1),
(2) Date: May 4, 2014

(87) PCT Pub. No.: WO2013/069636
PCT Pub. Date: May 16, 2013

(65) Prior Publication Data
US 2015/0053855 A1    Feb. 26, 2015

(30) Foreign Application Priority Data

Nov. 8, 2011   (JP) .................... 2011-244144

(51) Int. Cl.
*H01J 37/28*   (2006.01)
*G01B 15/00*   (2006.01)
*H01J 37/147*  (2006.01)
*H01J 37/20*   (2006.01)
*H01J 37/22*   (2006.01)

(52) U.S. Cl.
CPC .............. *H01J 37/28* (2013.01); *G01B 15/00* (2013.01); *H01J 37/147* (2013.01); *H01J 37/20* (2013.01); *H01J 37/22* (2013.01); *H01J 37/222* (2013.01); *H01J 2237/2806* (2013.01); *H01J 2237/2809* (2013.01); *H01J 2237/2817* (2013.01)

(58) Field of Classification Search
USPC ............. 250/307, 311, 306, 309, 310, 491.1, 250/492.22
See application file for complete search history.

(56) References Cited

U.S. PATENT DOCUMENTS

| 7,164,128 | B2   | 1/2007  | Miyamoto et al. |
| 7,807,980 | B2   | 10/2010 | Shishido et al. |
| 7,817,844 | B2 * | 10/2010 | Kitamura ................. G06K 9/00 348/125 |
| 2005/0133718 | A1 * | 6/2005 | Miyamoto et al. ........... 250/307 |

(Continued)

FOREIGN PATENT DOCUMENTS

| JP | 2005-183369 A | 7/2005 |
| JP | 2007-187538 A | 7/2007 |

*Primary Examiner* — Phillip A Johnston
*Assistant Examiner* — Hsien Tsai
(74) *Attorney, Agent, or Firm* — Miles & Stockbridge P.C.

(57) ABSTRACT

A scanning electron microscope (SEM) is configured so that SEM images are acquired while scanning a pyramid pattern on a sample plane from four directions. Landing angle of the electron beam is calculated from these SEM images, which are then averaged, whereby inclination angle of the electron beam that is less influenced from scan distortion can be found.

12 Claims, 10 Drawing Sheets

(56) References Cited

U.S. PATENT DOCUMENTS

| | | | |
|---|---|---|---|
| 2007/0145298 A1* | 6/2007 | Freer | H01J 37/244 250/492.21 |
| 2007/0164219 A1* | 7/2007 | Shishido | H01J 37/263 250/310 |
| 2012/0229814 A1* | 9/2012 | Freimann | G01B 11/2441 356/512 |

* cited by examiner (a) Original image (image free from scan distortion)

(b) Image including scan distortion (i) RR00  (ii) RR180  (iii) RR90  (iv) RR270

(a) Wafer loading angle: 0°

(b) Wafer loading angle: 180°

(a) Schematic view (b) SEM image

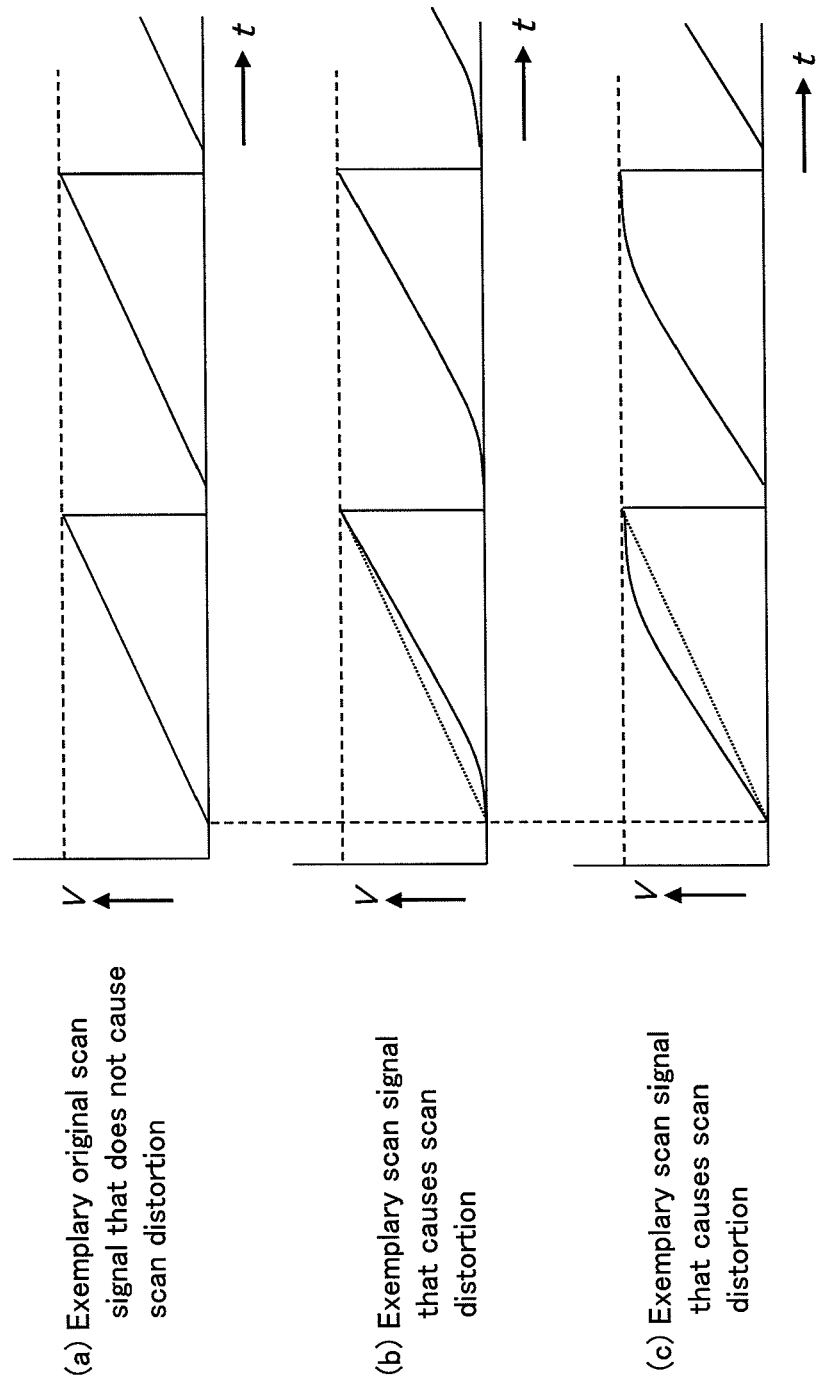

CHARGED PARTICLE BEAM APPARATUS AND METHOD OF CORRECTING LANDING ANGLE OF CHARGED PARTICLE BEAM

TECHNICAL FIELD

The present invention relates to a charged particle beam apparatus to measure a minute dimension such as a circuit pattern of a semiconductor device, and a method of correcting the landing angle of a charged particle beam.

BACKGROUND ART

Recent tendency of semiconductor devices having more minute patterns requires an increasing level of accuracy for measuring by a semiconductor dimension-measuring apparatus to measure dimensions of the patterns. Especially a demand for accuracy to reduce instrumental errors in dimension-measurement values among measuring apparatuses has become tighter year by year.

A semiconductor dimension-measuring apparatus is configured to irradiate a sample as an observation/measurement target with a focused electron beam for two-dimensionally scanning on the sample plane, obtain a scanning electron microscope (SEM) image based on detected secondary electrons generated from the irradiated sample, and designate a measurement portion of a pattern dimension on the SEM image, thus calculating the pattern dimensions for measurement using a detected signal waveform of the corresponding portion based on the magnification of the SEM image.

Meanwhile, in the case of a charged particle beam apparatus like a semiconductor dimension-measuring apparatus to acquire an SEM image, i.e., a charged particle beam image, when an electron beam as a charged particle beam for image acquisition is incident obliquely on a sample, the resultant charged particle beam image of the sample will change with the incident angle of the charged particle beam to the sample, i.e., the landing angle of the charged particle beam. In this case, the landing angle of a charged particle beam refers to the angle between the normal line of the sample and the beam optical axis of the charged particle beam.

In this way, since a dimension is measured using a semiconductor dimension-measurement apparatus based on an SEM image as stated above, the SEM image obtained will change with the incident angle of the electron beam to the sample even for measurement of dimensions of the same sample having the same pattern, and so the measurement value of the pattern dimension will change. Then, a semiconductor dimension-measurement apparatus is designed so that, when an electron beam is not deflected intentionally, the electron beam is incident on the sample plane having a pattern therein vertically to acquire an SEM image.

However, there are no techniques available for a charged particle beam apparatus including a semiconductor dimension-measurement apparatus to measure 0.1° or less of minute inclination angle of a charged particle beam that is defined by the optical axis of the charged particle optical system to deflect and focus the charged particle beam and the beam optical axis of the charged particle beam that is deflected by this charged particle optical system. This leads to a failure to check actually whether the electron beam is incident vertically on the sample plane or not along the optical axis direction of the electronic optical system that deflects and focuses the electron beam even when the electron beam is not deflected intentionally as stated above.

This means that, even when the electron beam, i.e., the charged particle beam is not deflected, a minute inclination of the charged particle beam occurs in each apparatus with respect to the optical axis of the electron optical system, i.e., the charged particle optical system, and the amount of such an inclination varies from one apparatus to another, and so there is an instrumental error that is a difference in dimensions measured among apparatuses due to this minute inclination.

Meanwhile, a conventionally available method to correct an inclination angle of the electron beam, i.e., the charged particle beam is to use a sample with a polyhedral structure having a known shape, e.g., a pyramid pattern having a known shape, formed therein as a calibration pattern as described in Patent Literature 1. Then, an SEM image of the pyramid pattern as the calibration pattern is acquired, the incident angle of the charged particle beam with respect to the sample when acquiring this SEM image, i.e., the landing angle of the charged particle beam is estimated based on a geometric deformation of the pyramid pattern on this SEM image, and inclination angle of the charged particle beam corresponding to each landing angle with respect to the sample is corrected based on the thus estimated landing angle.

FIG. 9 describes a pyramid pattern as one example of the calibration pattern. FIG. 9(a) schematically shows the three-dimensional shape of the pyramid pattern, and FIG. 9(b) shows an SEM image of the pyramid pattern part of the sample in which the pyramid pattern shown in FIG. 9(a) is formed.

In FIG. 9(a), the pyramid pattern 90 is formed with a square pyramid-shaped concave pattern having a (111) plane that is exposed by crystal anisotropy etching of a silicon (Si) wafer and three planes having a crystal plane orientation equal to this (111) plane. Thus, angles formed by the planes of such a pyramid pattern 90 are known. In the drawing, $P_0$ to $P_4$ represent apexes of the pyramid, where the apex $P_0$ corresponds to the bottom apex of the pyramid pattern 90 and the apexes $P_1$ to $P_4$ correspond to corners at the opening part of the pyramid pattern 90. The planes $P_0P_1P_2$, $P_0P_2P_4$, $P_0P_4P_3$ and $P_0P_3P_1$ of the pyramid pattern 90 have inclination angle with respect to the (100) plane of silicon as the wafer plane that is $\tan^{-1}(\sqrt{2}) \approx 54.74°$.

The pyramid pattern 90 as the calibration pattern may be a square pyramid-shaped convex pattern instead of the square pyramid-shaped concave pattern. The pattern shape itself of the polyhedral structure also is not limited to the square pyramid shape (pyramid shape) as shown in the drawing, which may be pyramid frustum shaped, for example.

As shown in FIG. 9(b), on a top-down SEM image 900 (SEM image acquired by observing a wafer plane with the pyramid pattern 90 formed therein from the vertically above in the illustrated example) of the pyramid pattern 90 shown in FIG. 9(a), four valley lines of the pyramid pattern 90 are straight lines $P_0P_1$, $P_0P_2$, $P_0P_3$ and $P_0P_4$ connecting the apex $P_0$ and the remaining apexes $P_1$ to $P_4$ based on a change of the values of detected signal, and the opening part of the pyramid pattern 90 appears as intersecting lines of the planes $P_0P_1P_2$, $P_0P_2P_4$, $P_0P_4P_3$ and $P_0P_3P_1$ of the pyramid pattern 90 with the wafer plane, i.e., line segments $P_1P_2$, $P_2P_4$, $P_4P_3$ and $P_3P_1$.

Then Patent Literature 1 describes a method of acquiring an SEM image by observing a sample with the pyramid pattern having a known shape formed therein from a predetermined desired observation direction, estimating incident angle of an electron beam with respect to the sample at that time based on a geometric deformation of the pyramid pattern on the SEM image, and adjusting the deflection of the electron beam, for example, so that the estimated incident angle becomes the setting value corresponding to the set desired observation direction, thus bringing the inclination angle of the electron beam to the observation direction of the sample.

Patent Literature 2 describes a method of acquiring an SEM image of a polyhedral pattern part of a sample with the polyhedral pattern having a known shape formed therein and estimating incident angle of an electron beam with respect to the sample based on a geometric deformation of the polyhedral pattern on the SEM image using the technique described in Patent Literature 1, while acquiring an SEM image of the polyhedral pattern part of the same sample as that is used for the estimation in another apparatus as well, and estimating incident angle of an electron beam with respect to the sample based on a geometric deformation of the polyhedral pattern on the SEM, whereby their incident angles of the electron beams are associated so that the incident angles of the electron beams with respect to the sample can be made to coincide with each other among the apparatuses, thus correcting an instrumental error that is a difference in dimension measured among the apparatuses due to differences in incident angle of the electron beam among the apparatuses.

CITATION LIST

Patent Literatures

Patent Literature 1: JP Patent Publication (Kokai) No. 2005-183369 A
Patent Literature 2: JP Patent Publication (Kokai) No. 2007-187538 A

SUMMARY OF INVENTION

Technical Problem

Measurement of incident angle of an electron beam and correction of an instrumental error that is a difference in dimensions measured among apparatuses due to a difference in inclination angle of an electron beam among the apparatuses by the methods described in Patent Literatures 1 and 2 as stated above, however, have the following two problems, which still makes it difficult to put them to practical use.

As a first problem, aside from a problem of an instrumental error that is a difference in dimensions measured among apparatuses due to a difference in inclination angle of an electron beam among the apparatuses as stated above, there is another problem for two-dimensionally scanning of an electron beam on a sample plane to acquire an SEM image thereof that a detection signal of secondary electrons that are acquired by continuously changing the inclination angle of the electron beam in a two-dimensional plane involves scan distortion. The scan distortion herein refers to a phenomenon where an SEM image of a sample acquired is deformed because of disturbance that a scan signal for scanning of the electron beam receives, a change in response speed of the scan signal itself and the like.

FIG. 10 describes an exemplary scan signal that causes scan distortion.

FIG. 10(a) shows an example of an original scan signal that does not generate scan distortion, and FIGS. 10(b) and (c) show examples of scan signal that causes scan distortion because of disturbance, a change in response speed of the signal itself and the like.

For instance, scan signal shown in FIG. 10(b) is an example such that the scan speed of the electron beam is low on the former part of the scan including the scan starting point and the scan speed of the electron beam is high on the latter part of the scan including the scan ending point compared with the original scan signal having a relationship between the magnitude V and time t of the scan signal as shown in FIG. 10(a). Scan signal shown in FIG. 10(c) is an example such that the scan speed of the electron beam is high on the former part of the scan including the scan starting point and the scan speed of the electron beam is low on the latter part of the scan including the scan ending point compared with the original scan signal.

In an extreme example, when an SEM image of a sample is acquired using the scan signal shown in FIGS. 10(b)(c), the thus acquired SEM image includes scan distortion, and so the pattern appears as a trapezoidal shape instead of the square pattern as the original shape. Although this scan distortion can be corrected to some extent in the apparatus, the distortion as a whole cannot be canceled. In this way, the SEM image of the pyramid pattern acquired by the apparatus includes scan distortion to an extent due to the apparatus itself, and so when incident angle of the electron beam with respect to the sample when acquiring this SEM image, i.e., the landing angle is estimated based on a geometric deformation of the pyramid pattern on the SEM image including this scan distortion and inclination angle of the electron beam is estimated so as to correspond to the thus estimated landing angle of the electron beam, such a measurement result will include an error.

As a second problem, since the degree of influences from this scan distortion varies from one apparatus to another, it is difficult to perform calibration among the apparatuses. For instance, Patent Literature 1 uses the pyramid pattern 90 having a known shape shown in FIG. 9 as a calibration sample. The pyramid pattern 90 is formed vertically with respect to the crystal orientation plane ((100) plane) of a silicon wafer, and the crystal orientation plane ((100) plane) itself of the silicon wafer is not always in parallel with the wafer plane. This is because, when a wafer is cut from an ingot of silicon, the wafer plane may be shifted from the crystal orientation plane ((100) plane) to an extent. The amount of shifting is typically 0.2° or less, and such amount is too large for a semiconductor dimension-measurement apparatus that measures inclination angle of an electron beam with accuracy of 0.05° or less.

Then, when the incident angle of an electron beam with respect to a sample, i.e., the landing angle of the electron beam is measured using the pyramid pattern 90, the measurement result actually includes the total of the inclination angle of the electron beam and the inclination angle of the wafer plane itself in which this pyramid pattern 90 is formed. This means that a measurement result of the inclination angle of the electron beam will vary with a difference in calibration samples used.

As a result, the method described in Patent Literature 1 fails to measure the inclination angle of the electron beam only because of influences from scan distortion and influences from shift of the wafer plane of the calibration sample from the crystal orientation plane as stated above, and can measure a relative angle only for the sample.

In that case, even when calibration is performed among apparatuses as in Patent Literature 2, these apparatuses cannot be adjusted to have a certain inclination angle because they are differently influenced from scan distortion. Further since the shift of a wafer plane of a calibration sample from the crystal orientation plane varies from one sample to another, measurement has to be performed using the same calibration sample for different apparatuses, which means that one calibration sample has to be shared among the apparatuses as a calibrator.

In view of the aforementioned problems, it is an object of the present invention to provide a charged particle beam apparatus to measure a minute dimension such as a circuit pattern of a semiconductor device, the charged particle beam apparatus being capable of reducing an instrumental error that is a difference in dimensions measured among apparatuses resulting from scan distortion and variations in landing angle of a charged particle beam and so measuring absolute inclination angle of a charged particle beam precisely, while achieving improved workability of calibration among apparatuses, as well as a method of correcting the landing angle of a charged particle beam.

Solution to Problem

The present invention provides a charged particle beam apparatus configured to acquire a charged particle beam image of a polyhedral structure having a known shape that is formed on a sample plane; estimate a landing angle of a charged particle beam with respect to the sample when acquiring this charged particle beam image based on a geometric deformation of the polyhedral structure on the image; and estimate inclination angle of a charged particle beam corresponding to each landing angle of the charged particle beam based on the estimated landing angle of the charged particle beam, or such a method of correcting landing angle of a charged particle beam, and has the following features:

(1) when acquiring a charged particle beam image of a polyhedral structure having a known shape that is formed on a sample plane, a charged particle beam image of the polyhedral structure is acquired while changing a scanning direction between mutually opposed directions. Then results of these charged particle beam images of the polyhedral structure in the mutually opposed directions of the scanning direction are averaged, whereby an instrumental error that is a difference in dimensions measured among apparatuses resulting from influences from scan distortion and variations in landing angle of the charged particle beam can be reduced, and inclination angle of the charged particle beam can be measured precisely based on the averaged image result; and (2) when acquiring a charged particle beam image of a polyhedral structure having a known shape that is formed on a sample plane, a charged particle beam image of the polyhedral structure is acquired while changing a loading direction of a sample between mutually opposed directions. Then results of these charged particle beam images of the polyhedral structure in the mutually opposed directions of the loading direction are averaged, whereby an instrumental error that is a difference in dimensions measured among apparatuses resulting from influences from scan distortion and variations in landing angle of the charged particle beam can be reduced, and inclination angle of the charged particle beam can be measured precisely based on the averaged image result.

This application claims the benefit of priority to JP Patent Application No. 2011-244144 based thereon, the specification and/or the drawings of which are herein incorporated by reference.

Advantageous Effects of Invention

The present invention can suppress influences from scan distortion and can cancel the inclination of a sample plane itself in which a polyhedral structure having a known shape is formed as a calibration pattern, and so landing angle of a charged particle beam with respect to a sample plane can be measured precisely with absolute inclination angle of the charged particle beam, thus reducing an instrumental error that is a difference in dimensions measured among apparatuses resulting from scan distortion and variations in landing angle of charged particle beam.

BRIEF DESCRIPTION OF DRAWINGS

FIG. 10 describes an exemplary scan signal that causes scan distortion.

DESCRIPTION OF EMBODIMENTS

Figure 1:
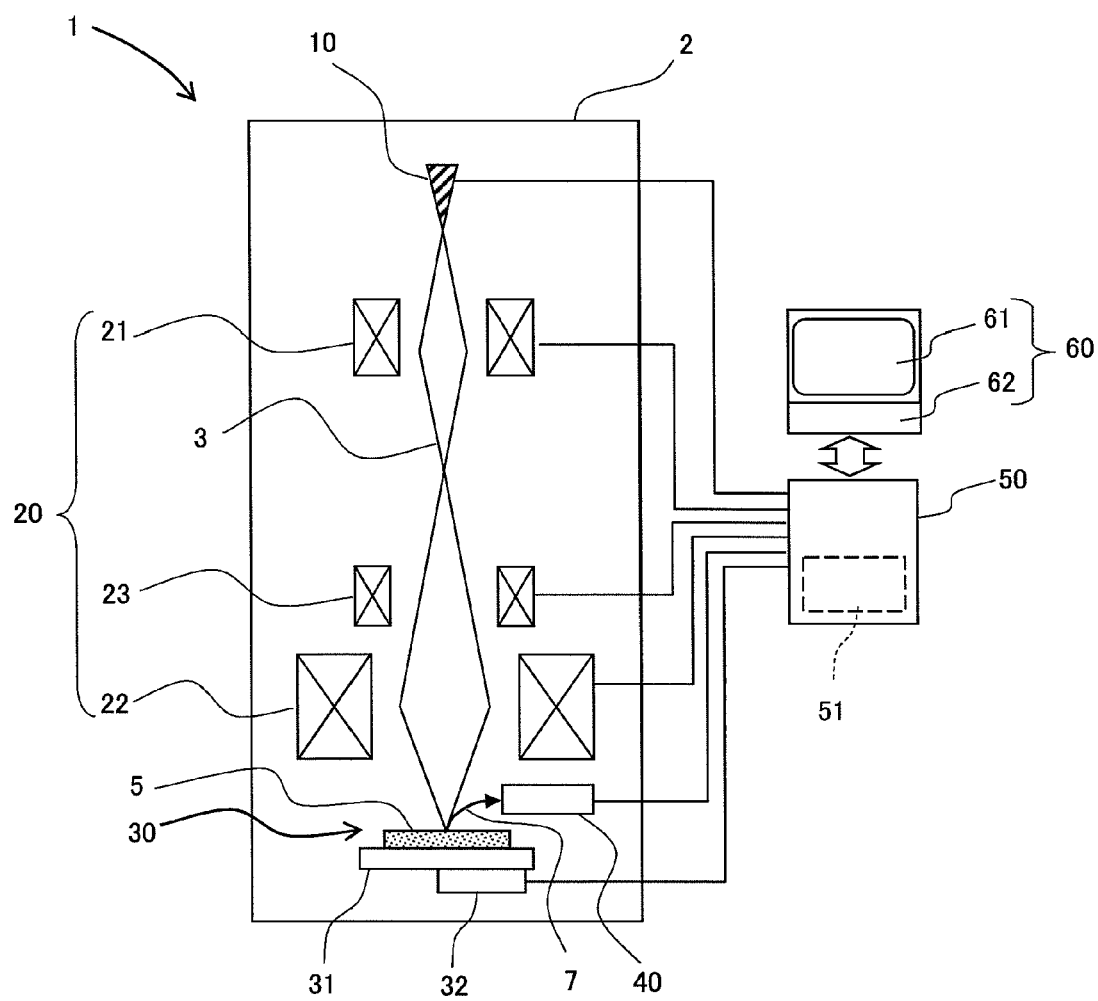
FIG. 1 schematically shows the configuration of a scanning electron microscope equipped with a dimension-measuring function that is one embodiment of a charged particle beam apparatus of the present invention.

Referring to the drawings, the following describes one embodiment of a charged particle beam apparatus and a method of correcting a beam landing angle according to the present invention, by way of an example of a scanning electron microscope (critical dimension SEM) equipped with a dimension-measuring function.

FIG. 1 schematically shows the configuration of a scanning electron microscope equipped with a dimension-measuring function that is one embodiment of a charged particle beam apparatus of the present invention.

A scanning electron microscope 1 includes an electron gun 10, an electron optical system 20, a sample chamber 30 and a secondary electron detector 40 in a casing 2, and includes a processor 50 that controls these parts.

The electron gun 10 as a charged particle beam gun generates electrons as one type of charged particles, and emits an electron beam 3 as a charged particle beam. The electron optical system 20 as a charged particle optical system includes a focusing lens 21, an objective lens 22 and a deflector 23. The electron beam 3 emitted from the electron gun 10 is focused by the focusing lens 21 and the objective lens 22 of the electron optical system 20, and is deflected by the deflector 23 to be applied on a sample plane disposed in the sample chamber 30 for irradiation.

Figure 9:
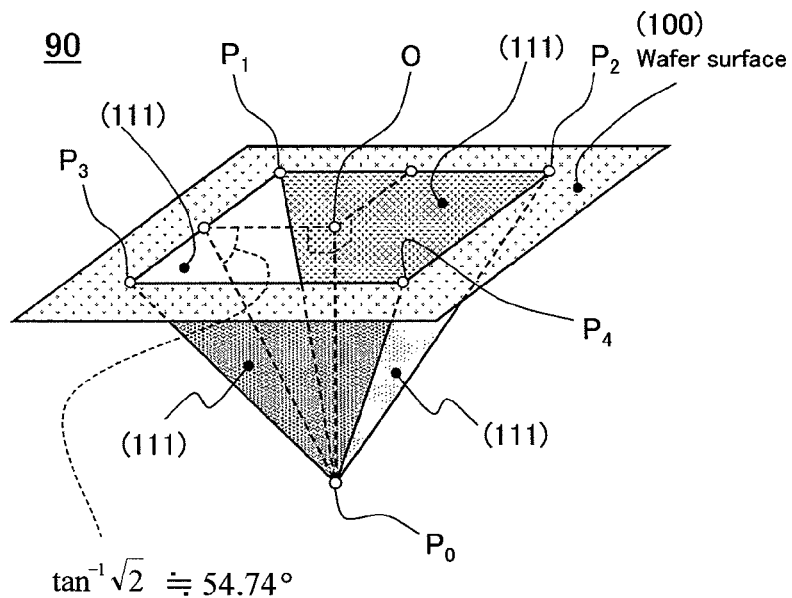
FIG. 9 describes a pyramid pattern as one example of a calibration pattern.
Figure 9:
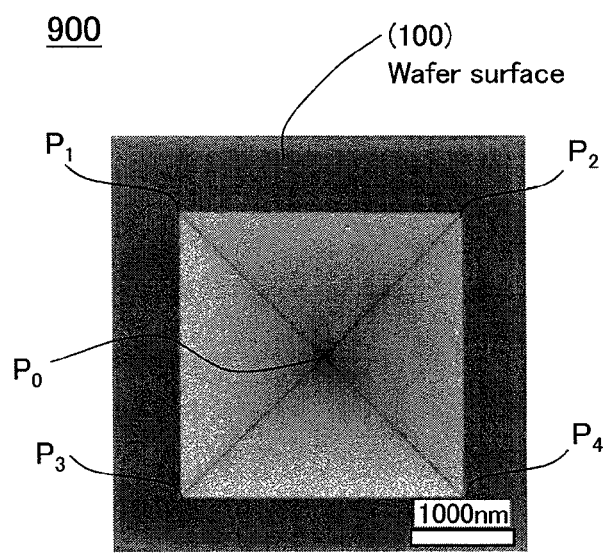

The sample chamber 30 accommodates a sample as an observation/measurement target that is irradiated with the electron beam 3. This sample as an observation/measurement target includes a sample 5 as a calibration sample shown in FIG. 9. The sample chamber 30 is provided with a stage 31, on which a sample as an observation/measurement target including the sample 5 is loaded, and the stage 31 includes a stage mechanism 32 attached thereto. The stage mechanism 32 as a stage moving mechanism moves and displaces the stage 31 in the sample chamber 30 to move the irradiation position with the electron beam 3 and the observation view on the sample plane. The stage mechanism 32 of the present embodiment can serve as a stage rotating mechanism to rotate the orientation of the stage 31 in the sample chamber 30, thus changing the orientation of the sample loaded on the stage 31 including the inverted orientation. FIG. 1 illustrates a state where the sample 5 as a calibration sample shown in FIG. 9 is loaded on the stage 31.

Secondary electrons 7 as charged particles that are emitted from the sample irradiated with the electron beam 3 are detected as a brightness signal by a secondary electron detector 40 as a charged particle detector. A detected signal is supplied from the secondary electron detector 40 to the processor 50, and the processor 50 generates an SEM image of the irradiated area with the electron beam 3 on the sample plane.

The processor 50 includes a computer device or the like, for example, which is connected to various parts of the apparatus and is also connected to an input/output device 60 as a user interface. The input/output device 60 includes a display 61 as a display device and a manipulation device 62 such as a mouse or a keyboard.

The processor 50 controls various parts of the scanning electron microscope 1 to let the scanning electron microscope perform various processing including acquisition of an SEM image as stated above.

For instance, the processor 50 controls the focusing lens 21 and the objective lens 22 of the electron optical system 20 to adjust measurement magnification and to adjust focus. The processor 50 controls the deflector 23 to deflect the electron beam 3, i.e., perform beam tilt so that the incident angle of the electron beam 3, i.e., the landing angle to the sample as an observation/measurement target including the sample 5 is a set value corresponding to the predetermined observation direction.

Meanwhile, the processor 50 controls the stage mechanism 32 so as to move the irradiation position with the electron beam 3 and the observation view on the sample plane, thus moving the stage 31 in the sample chamber 30 two-dimensionally or three-dimensionally. The processor 50 further performs image shift to change the irradiation position (scanning position) of the electron beam 3 on the sample by the deflector 23 to accurately move the irradiation position with the electron beam 3 and the observation view with reference to the observation point on the sample without moving the stage by this stage mechanism 32.

The processor 50 generates an SEM image of the irradiation area with electron beam 3 on the sample based on a detected signal supplied from the secondary electron detector 40 in response to the irradiation and scanning of the electron beam 3 on the sample, and associates the thus generated SEM image data, observation condition data such as measurement magnification as stated above used for the generation, detected signal data and the like with the observed sample to save and store it in a storage unit 51 or to display it on the display 61 of the input/output device 60 for outputting.

Additionally when a measurement portion of pattern dimensions is designated on the SEM image with the manipulation device 62 and the display 61 of the input/output device 60, the processor 50 calculates a pattern dimension of the measurement portion on the basis of magnification data of the SEM image using detected signal data and the like of the corresponding part of the SEM image, and associates this measurement dimension data, designation data of the measurement portion and the like with the SEM image and the observed sample to save and store it in the storage unit 51 or to display it on the display 61 of the input/output device 60 for outputting.

In the scanning electron microscope 1 of the present embodiment, the processor 50 further functions as a landing angle measurement unit and a landing angle correction unit of the electron beam 3 to correct the landing angle of the electron beam 3 as described in Patent Literature 1.

That is, when an instruction is issued to execute correction processing of a landing angle of the electron beam 3, the processor 50 firstly serves as a landing angle measurement unit of the electron beam 3 to use the sample 5 having a pyramid pattern 90 of a known shape as shown in FIG. 9 formed therein to observe the part of the pyramid pattern 90 of the sample 5 in an image shift manner by performing beam tilt of the electron beam 3 in a set desired observation direction, thus acquiring an SEM image thereof. Then, the processor 50 estimates the landing angle of the electron beam 3 with respect to the sample 5 at this time based on a geometric deformation of the pyramid pattern 90 on the SEM image. Herein, the issuance to execute correction processing of a landing angle of the electron beam 3 is performed by manipulation of the manipulation device 62 of the input/output device 60 or based on the sufficiency of predetermined execution conditions. The desired observation direction is set by setting the landing angle of the electron beam 3.

Specifically when the landing angle of the electron beam 3 corresponding to the desired observation direction is set as a setting value, the processor 50 performs beam tilt of the electron beam 3 by the deflector 23 so that the electron beam 3 has an inclination angle corresponding to the landing angle of the electron beam 3 as the setting value based on a relationship data table between the landing angle of the electron beam 3 and the inclination angle of the electron beam 3 that is stored in the storage unit 51 beforehand, for example, thus acquiring an SEM image of the part of the pyramid pattern 90 in an image shift manner.

Then the processor 50 measures the landing angle of the electron beam 3, e.g., uses image data relating to the pyramid pattern 90 on an SEM image that is obtained by image shift of the pyramid pattern 90 when the electron beam 3 is not subjected to beam tilt (in the state where the electron beam 3 is incident on the sample 5 vertically) and image data relating to the pyramid pattern 90 on an SEM image that is obtained with the electron beam 3 that is subjected to beam tilt by the deflector 23 so as to correspond to the setting value, and estimates the landing angle of the electron beam 3 of the SEM image that is acquired corresponding to the setting value on the basis of a geometric deformation of the pyramid pattern 90 on the SEM image acquired corresponding to the setting value.

After estimating the landing angle of the electron beam 3 on the SEM image acquired corresponding to the setting value, the processor 50 serves as a landing angle correction unit of the electron beam 3 to correct a correspondence relationship between the landing angle of the electron beam 3 and the inclination angle of the electron beam 3 that is stored in the relationship data table in the storage unit 51 so that the inclination angle of the electron beam 3 corresponding to the setting value can be the inclination angle of the electron beam 3 corresponding to the thus estimated landing angle of the electron beam 3, thus adjusting so that the actual landing angle of the electron beam 3 becomes the set landing angle of the electron beam 3.

Additionally the processor 50 is configured to on-screen display (OSD) a graphical user interface (GUI) screen to enable selection or instruction of settings and execution of these various processing on the display 61 of the input/output device 60.

The scanning electron microscope 1 according to the present embodiment is further configured so that, when the processor 50, as the landing angle measurement unit and the landing angle correction unit of the electron beam 3, performs the aforementioned correction processing of a landing angle of the electron beam 3 using the sample 5 as a calibration sample as stated above, the processor 50 similarly uses the sample 5 having the pyramid pattern 90 formed therein as shown in FIG. 9 to perform scan distortion measurement error suppression processing to suppress a measurement error of the landing angle due to scan distortion and to perform pattern inclination measurement error suppression processing to suppress a measurement error of the landing angle due to inclination of a sample plane on which the pyramid pattern 90 is formed.

The processor 50 performs the scan distortion measurement error suppression processing so that the landing angle measured by the measurement unit of the landing angle of the electron beam 3 as well as the correspondence relationship between the landing angle of the electron beam 3 that is corrected by the landing angle correction unit and the inclination angle of the electron beam 3 can be based on the landing angle of the electron beam 3 less influenced from measurement error due to scan distortion. The processor 50 further performs the pattern inclination measurement error suppression processing to suppress a measurement error due to inclination generated between the sample plane of the sample 5 as a calibration sample and the pyramid pattern 90 to find a value based on the absolute inclination angle of the electron beam 3 only.

The absolute inclination angle of the electron beam 3 herein refers to the electron beam emission direction when the electron beam is not deflected intentionally, i.e., assuming the absolute coordinate system having z-axis as the optical axis direction of the electron optical system 20 and x-axis and y-axis that are orthogonal to the z-axis and are mutually orthogonal, the absolute inclination angle is the inclination angle of the optical axis of the electron beam 3 with reference to the optical axis of the electron optical system 20, i.e., z-axis on such an absolute coordinate system.

Next the following describes the processing by the processor 50 in the scanning electron microscope 1 according to the present embodiment to suppress a measurement error due to scan distortion of the landing angle and to suppress a measurement error due to pattern inclination of the landing angle.

In the scanning electron microscope 1 according to the present embodiment, the processor 50 serves as a landing angle measurement unit and a landing angle correction unit to perform correction processing of a landing angle of the electron beam 3 as described in Patent Literature 1. For acquisition of an SEM image based on the pyramid pattern 90 as a calibration pattern, the processor 50 performs processing to suppress measurement error in landing angle due to scan distortion and processing to suppress measurement error due to pattern inclination of the calibration pattern beforehand, thereby solving a problem of the measurement error due to scan distortion generated in the SEM image and a problem of the measurement error due to pattern inclination, thus precisely controlling the landing angle of a charged particle beam with respect to the sample plane of the calibration sample based on absolute inclination angle of the charged particle beam.

Processing to Suppress a Measurement Error of Landing Angle Due to Scan Distortion To begin with, the following describes processing to suppress a measurement error of landing angle due to scan distortion.

Scan distortion refers to a phenomenon where a part of a sample observed is distorted on an SEM image thereof because of disturbance that a scanning signal for scanning of the electron beam 3 receives, a change in response speed of the scanning signal itself and the like.

Figure 2:
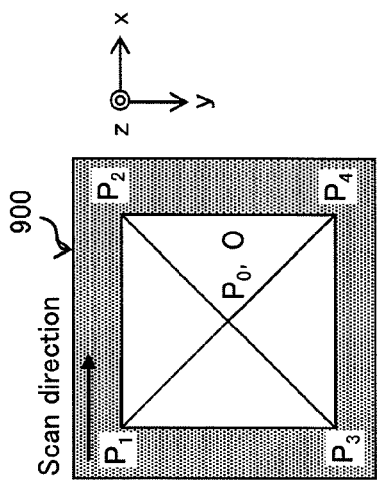
FIG. 2 schematically describes influences from scan distortion.
Figure 2:
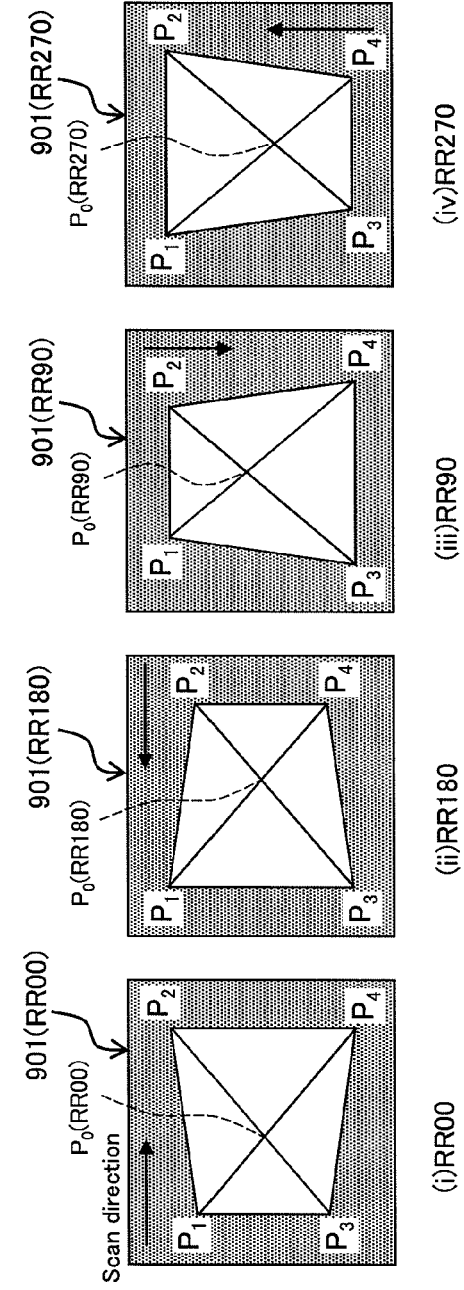

FIG. 2 schematically describes influences from scan distortion by way of an example using the sample 5 having a pyramid pattern 90 formed therein shown in FIG. 9 as a calibration sample. For ease of explanation, it is assumed that the sample plane on which the pyramid pattern 90 is formed agrees with the crystal orientation plane ((100) plane). Arrows in the drawings represent the raster scanning direction of the electron beam 3.

FIG. 2(a) shows a top-down SEM image 900, where a part of the pyramid pattern 90 of the sample 5 shown in FIG. 9 is observed in an image shift manner when there is no scan distortion generated.

In this case, the opening part of the pyramid pattern 90 represented with intersecting lines $P_1P_2$, $P_2P_4$, $P_4P_3$, $P_3P_1$ of the pyramid pattern 90 and the wafer plane appears like a square, and four valley lines of the pyramid pattern 90 represented with straight lines $P_0P_1$, $P_0P_2$, $P_0P_3$, $P_0P_4$ connecting the apex $P_0$ and other apexes $P_1$ to $P_4$ appear as diagonal lines of the opening part appearing as a square at the sample plane. This means that the bottom apex $P_0$ of the pyramid pattern 90 appears at the center O of the opening part appearing as a square.

On the other hand, FIG. 2(b) shows a top-down SEM images 901(RR00), 901(RR180), 901(RR90), 901(RR270) that are observed images of the part of the pyramid pattern 90 of the sample 5 shown in FIG. 9 by changing rotation angles RR when there is scan distortion generated, which are acquired by changing the scanning directions of the electron beam 3 in an image shift manner by raster rotation.

The SEM image 901(RR00) is a top-down SEM image for the rotation angle RR of 0°, the SEM image 901(RR180) is a top-down SEM image for the rotation angle RR of 180°, the SEM image 901(RR90) is a top-down SEM image for the rotation angle RR of 90° and the SEM image 901(RR270) is a top-down SEM image for the rotation angle RR of 270°.

Then comparisons between the bottom apex $P_0$ of the pyramid pattern 90 in the SEM image 900 free from scan distortion shown in FIG. 2(a) and the bottom apexes $P_0$ of the SEM images 901(RR00), 901(RR180), 901(RR90) and 901(RR270) including scan distortion shown in FIG. 2(b) are as follows.

In the case of the SEM image 901(RR00), the bottom apex $P_0$(RR00) appears to be offset to left in the horizontal direction of the image from the position of the bottom apex $P_0$ of the SEM image 900 in the x-axis direction (corresponding to the x-axis direction on the absolute coordinate system with reference to the optical axis direction of the electron optical system 20) of the coordinate system on the image. On the other hand, the bottom apex $P_0$(RR00) does not appear to be offset apparently vertically on the image from the position of the bottom apex $P_0$ of the SEM image 900 in the y-axis direction (corresponding to the y-axis direction on the absolute coordinate system with reference to the optical axis direction of the electron optical system 20) of the coordinate system on the image.

In the case of the SEM image 901(RR180), the bottom apex $P_0$(RR180) appears to be offset to right from the position of the bottom apex $P_0$ of the SEM image 900 in the horizontal direction of the image that is opposite of the SEM image 901(RR00) in the x-axis direction of the coordinate system on the image. On the other hand, similarly to the case of the SEM image 901(RR00), the bottom apex $P_0$(RR180) does not appear to be offset apparently vertically on the image from the position of the bottom apex $P_0$ of the SEM image 900 in the y-axis direction of the coordinate system on the image.

In the case of the SEM image 901(RR90), the bottom apex $P_0$(RR90) appears to be offset upward vertically on the image from the position of the bottom apex $P_0$ of the SEM image 900 in the y-axis direction of the coordinate system on the image. On the other hand, the bottom apex $P_0$(RR90) does not appear to be offset apparently horizontally on the image from the position of the bottom apex $P_0$ of the SEM image 900 in the x-axis direction of the coordinate system on the image.

In the case of the SEM image 901(RR270), the bottom apex $P_0$(RR270) appears to be offset downward that is opposite of the SEM image 901(RR90) vertically on the image from the position of the bottom apex $P_0$ of the SEM image 900 in the y-axis direction of the coordinate system on the image. On the other hand, similarly to the case of the SEM image 901(RR90), the bottom apex $P_0$(RR270) does not appear to be offset apparently horizontally on the image from the position of the bottom apex $P_0$ of the SEM image 900 in the x-axis direction of the coordinate system on the image.

In this way, in the illustrated example, the pyramid pattern 90 of the sample 5 has an opening part of a shape including largely affected from the distortion more on the scan starting side than on the scan ending side for any rotation angle RR. This means that, when the scanning directions of the image shift are mutually opposite horizontally on the image as in the SEM image 901(RR00) and the SEM image 901 (RR180), for example, their parts largely and less affected by distortion become opposite horizontally on the image. When the scanning directions of the image shift are mutually opposite vertically on the image as in the SEM image 901(RR90) and the SEM image 901(RR270), their parts largely and less affected by distortion become opposite vertically on the image.

Note here that, for the SEM image 900 free from scan distortion shown in FIG. 2(*a*), even when the scanning direction of the electron beam 3 in an image shift manner is changed in rotation angle RR as in 0°, 180°, 90° and 270° for raster rotation, their respective SEM images 900(RR00), 900(RR180), 900(RR90) and 900(RR270) do not change in shape of the pyramid pattern 90, and positions of the apexes $P_0$ to $P_4$ also do not change on the image.

In this way, influences from scan distortion depend on the scanning direction of the electron beam 3 to acquire an SEM image, and so influences from scan distortion can be suppressed by averaging the results of the images of the SEM images 901(RR00), 901(RR180), 901(RR90) and 901 (RR270) that are shot in an image shift manner from their scanning directions.

Then, in order to perform image shift while suppressing influences from scan distortion, thus acquiring an SEM image as in the original SEM image 900 free from scan distortion shown in FIG. 2(*a*), the processor 50 of the present embodiment is configured to perform processing to suppress a measurement error in landing angle due to scan distortion as stated below.

During the processing to suppress a measurement error in landing angle due to scan distortion, the processor 50 firstly serves as a calibration pattern image acquisition unit to bring an observation position to a position on the sample plane of the pyramid pattern 90 as a calibration sample, e.g., to the position on the sample plane corresponding to the apex $P_0$ of the original pyramid pattern 90 as shown in FIG. 2(*a*), and changes the rotation angle RR in at least two opposed directions by raster rotation, thus acquiring an SEM image 901 of the pyramid pattern 90 for each rotation angle RR in an image shift manner. The present embodiment changes the rotation angle RR as in 0°, 180°, 90° and 270° to acquire SEM images 901 in the opposed two directions in each of the x-axis direction and the y-axis direction on the image that are the SEM images 901(RR00), 901(RR180), 901 (RR90) and 901(RR270) shown in FIG. 2(*b*). The present embodiment performs the processing to suppress a measurement error in landing angle by acquiring the SEM images 901 in the opposed two directions in each of the x-axis direction and the y-axis direction on the image so as to correspond to the opposed two directions in each scanning direction of the electron beam 3 by the deflector 23. However, when there is no difference in influences from scan distortion between the scanning directions, for example, the processing to suppress a measurement error in landing angle can be executed in opposed two directions in any one of the x-axis direction and the y-axis direction only.

Then similarly to the aforementioned correction processing of landing angle of the electron beam 3, the processor 50 serves as the landing angle measurement unit of the electron beam 3 to estimate the incident angle of the electron beam 3 on the sample 5, i.e., the landing angle of the electron beam 3 each for the acquisition of the pyramid patterns 90 of the SEM images 901(RR00), 901(RR180), 901(RR90) and 901 (RR270) based on a geometric deformation of each of the pyramid patterns 90 of the SEM images 901(RR00), 901 (RR180), 901(RR90) and 901(RR270).

This allows the processor 50 to acquire the landing angles of the electron beam 3 with reference to the sample plane of the sample 5 as well as the inclination angles of the electron beam 3, which are set as observation directions to acquire the same shapes as the SEM images 901(RR00), 901 (RR180), 901(RR90) and 901(RR270) for the pyramid pattern 90.

Figure 3:
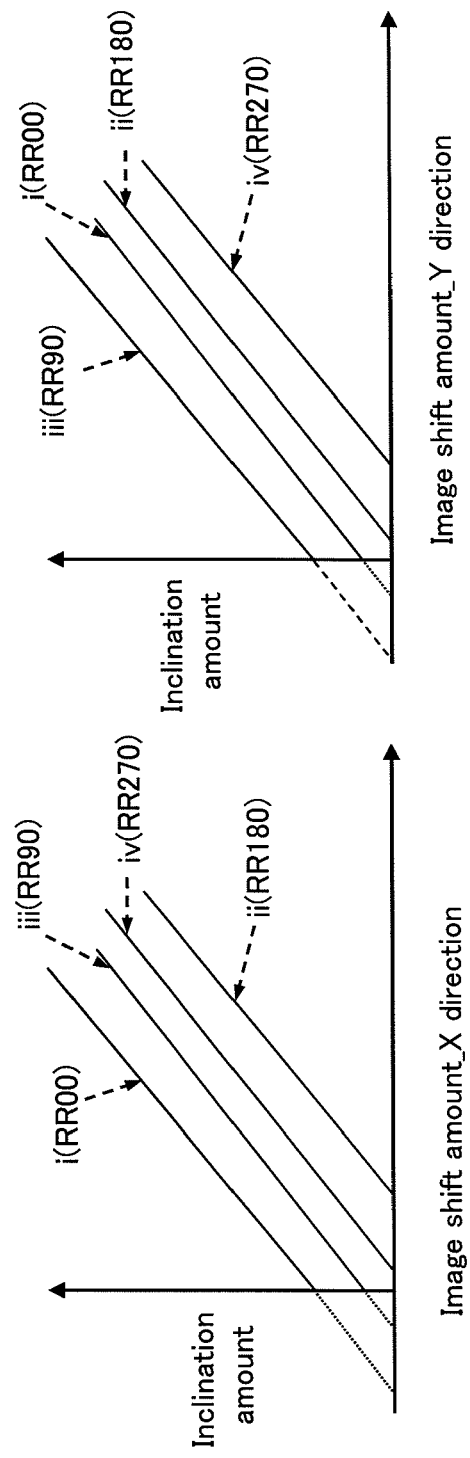
FIG. 3 shows a relationship between the image shift amount and the inclination angle of an electron beam.

FIG. 3 shows a relationship between the image shift amount and the inclination angle of electron beam.

FIG. 3(*a*) relates to landing angles of the electron beam 3 that are estimated based on the SEM images 901(RR00), 901(RR180), 901(RR90) and 901(RR270) and shows a relationship between the image shift amount in the x-axis direction on the absolute coordinate system corresponding to the horizontal direction on the screen and the inclined amount of the electron beam 3 in the x-axis direction corresponding to the estimated landing angles of the electron beam.

FIG. 3(*b*) similarly relates to landing angles of the electron beam 3 that are estimated based on the SEM images 901(RR00), 901(RR180), 901(RR90) and 901(RR270) and shows a relationship between the image shift amount in the y-axis direction on the absolute coordinate system corresponding to the vertical direction on the screen and the inclined amount of the electron beam 3 in the y-axis direction corresponding to the estimated landing angles of the electron beam.

In the drawings, characteristics indicated as i(RR00), ii(RR180), iii(RR90), and iv(RR270) represent relationships at the landing angle of the electron beam 3 estimated based on each of the SEM images 901(RR00), 901(RR180), 901 (RR90) and 901(RR270) between the image shift amount in the x-axis direction or the y-axis direction and the inclined amount of the electron beam 3 in the corresponding x-axis direction or y-axis direction, i.e., the x-axis direction component or the y-axis direction component of the inclination angle of the electron beam 3.

Herein to average the results of the SEM images 901 (RR00), 901(RR180), 901(RR90) and 901(RR270) that are shot in an image shift manner from the corresponding scanning directions means to acquire, for a scan signal, an SEM image of the pyramid pattern 90 in an image shift manner with the scan signal having characteristics as the average of the characteristics i(RR00), ii(RR180), iii(RR90) and iv(RR270) for the x-axis direction and the y-axis direction at the average landing angle of the landing angles of the electron beam 3 that is estimated based on the images 901(RR00), 901(RR180), 901(RR90) and 901(RR270).

Then the inclination angle of the electron beam 3 corresponding to the landing angle of the electron beam 3 for the sample 5 that is set originally when the observation position is adjusted is adapted to the inclination angle of the electron beam 3 corresponding to the average landing angle of the electron beam 3, and the scan signal is adapted so as to generate inclination angle of the electron beam 3 corresponding to the image shift amount corresponding to the averaged characteristics of the characteristics i(RR00), ii(RR180), iii(RR90) and iv(RR270) for the x-axis direction and the y-axis direction. Thereby, the SEM image 901 (RR00) shown in FIG. 2(b) can be less influenced from scan distortion, and can be brought closer to the original SEM image 900 that is free from scan distortion shown in FIG. 2(a).

To this end, the processor 50 estimates the incident angle of the electron beam 3 on the sample 5, i.e., the landing angle of the electron beam 3 when acquiring each of the SEM images 901(RR00), 901(RR180), 901(RR90) and 901 (RR270) for the rotation angles RR of 0°, 180°, 90° and 270°, and firstly serves as a scan distortion measurement error suppression unit to average the landing angles of the electron beam 3 for them. Then the processor 50 corrects the inclination angle of the electron beam 3 corresponding to the landing angle of the electron beam 3 for the sample 5 that is set originally when the observation position is set to the inclination angle of the electron beam corresponding to the thus averaged estimated landing angle, and stores the same.

Next, in order to let the scan signal for image shift less influenced from scan distortion, the processor 50 corrects the scan signal so as to generate the inclination angle of the electron beam 3 corresponding to each image shift amount of the averaged characteristics of the characteristics indicated with i(RR00), ii(RR180), iii(RR90) and iv(RR270) as stated above, and stores the same.

Then, for improved measurement accuracy, when there is a measurement point where a pyramid pattern 90 is formed for observation at another position on the sample plane of the sample 5, the processor 50 performs, as the calibration pattern image acquisition unit, the landing angle measurement unit of the electron beam 3 and the scan distortion measurement error suppression unit, similar processing to suppress a measurement error of landing angle for this pyramid pattern 90 as well.

Then, the processor 50 ends the processing to suppress a measurement error of landing angle for all of the pyramid patterns 90 at the measurement points on the sample plane of the sample 5, and then further averages the inclination angles of the electron beam 3 and the scan signals that are corrected and stored for all of the measurement points to improve the accuracy of the inclination angle of the electron beam 3 less influenced from scan distortion and scan signal.

Then, beam inclination correction, for example, is performed for each apparatus using these measurement results, whereby a difference in dimensions measured among the apparatuses can be reduced.

On the other hand, a scanning electron microscope equipped with a conventional dimension-measuring function does not change the scanning direction of the electron beam 3 in an image shift manner between opposed two directions, but uses an SEM image 901(RR00) only of a calibration pattern that is acquired setting a predetermined single scanning direction, e.g., the rotation angle RR at 0°, for example. Then, the processor 50, as a correction unit of the landing angle of the electron beam 3, performs correction processing of the landing angle of the electron beam 3 based on the SEM image, and so the landing angle estimated by the landing angle measurement unit and a correspondence between the landing angle of the electron beam 3 and the inclination angle of the electron beam 3 that is corrected by the landing angle correction unit are values including offset, and so have a measurement error.

Processing to Suppress Measurement Error in Landing Angle Due to Pattern Inclination Next the following describes processing to suppress a measurement error in landing angle due to pattern inclination.

A shift between the wafer plane and the crystal orientation plane of a calibration sample varies from one sample 5 as the calibration sample to another.

Figure 4:
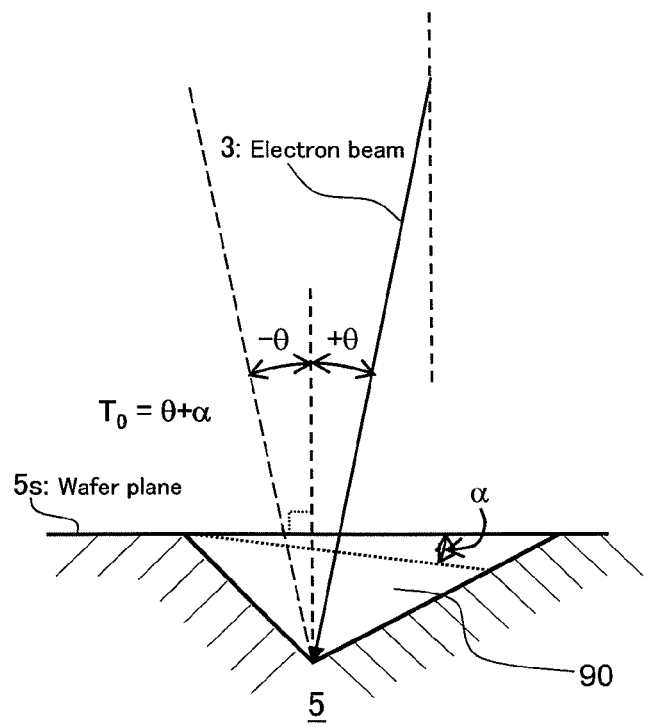
FIG. 4 is a cross sectional view of a pattern to observe a calibration sample.
Figure 4:
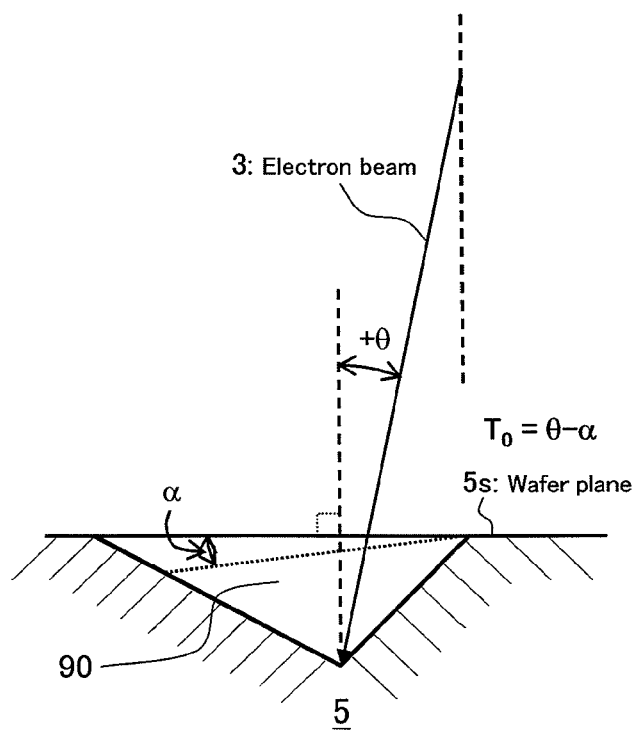

FIG. 4 is a cross sectional view of a pattern to observe a calibration sample formed at the wafer plane that does not agree with the crystal orientation plane of the silicon wafer.

FIG. 4(a) shows a state where the calibration sample is loaded on the stage 31 while setting the wafer loading angle at 0° that is a predetermined orientation, which is then disposed in the sample chamber 30. Meanwhile, FIG. 4(b) shows a state where the calibration sample is loaded on the stage 31 while setting the wafer loading angle at 180° that is in the direction opposite of the wafer load angle 0°, which is then disposed in the sample chamber 30.

In FIG. 4, the sample plane of the sample 5, i.e., the wafer plane 5s of the silicon wafer on which the pyramid pattern 90 is formed is inclined with respect to its crystal orientation plane ((100) plane), i.e., the pyramid pattern 90 by inclination angle α, and the electron beam 3 is incident on the sample plane 5s of the sample 5 at landing angle θ.

For simplicity's sake, the following assumes that the normal line of the sample 5, i.e., the normal line of the sample plane 5s on which the pyramid pattern 90 is formed is in parallel with the optical axis direction of the electron optical system 20, and the landing angle θ of the electron beam 3 with reference to the sample plane 5s has the magnitude corresponding that of the inclination angle of the electron beam 3.

In this case, as shown in FIG. 4(a) and FIG. 4(b), the inclination angle cc between the sample plane 5s of the sample 5, i.e., the sample plane (wafer plane) 5s of the silicon wafer and its crystal orientation plane ((100) plane) does not change in the plane as long as it is within the wafer irrespective of a wafer loading angle. This means that, when the sample 5 is disposed in the sample chamber 30 while rotating it by 180° in the mutually opposed directions at the wafer loading angles 0° and 180°, then the inclination of the crystal orientation plane ((100) plane) with respect to the sample plane (wafer plane) 5s becomes mutually symmetrical about the normal line of the sample plane 5s as the axis between the wafer loading angles 0° and 180°.

Herein the landing angles of the electron beam 3 with respect to the sample plane 5s that is measured by the processor 50 functioning as the aforementioned landing angle measurement unit of the electron beam 3 are referred to as landing angles $T_{00}$, $T_{180}$ for the wafer loading states at the wafer loading angles 0° and 180° of the sample 5, respectively.

For instance, the landing angle $T_{00}$ is estimated as follows. That is, the processor 50 as the landing angle measurement unit observes a part of the pyramid pattern 90 of the sample 5 disposed in the sample chamber 30 at the wafer loading angle of 0° in an image shift manner while performing beam tilt to the electron beam 3 in a predetermined observation direction, i.e., at the inclination angle θ in the illustrated example, thus acquiring an SEM image thereof. Then, the landing angle $T_{00}$ of the electron beam 3 with respect to the sample 5 at this time is estimated based on a geometric deformation of the pyramid pattern 90 on the acquired SEM image where the inclination angle of the electron beam 3 is θ. The landing angle $T_{180}$ also can be estimated similarly.

In this way, when the sample 5 is disposed at the wafer loading angles of 0° and 180°, the inclination angles cc with respect to the crystal orientation plane ((100) plane) will be measured in a reversed manner in the landing angle measurement processing by the landing angle measurement unit of the electron beam 3 that is based on a geometric deformation of the pyramid pattern 90.

That is, the landing angles $T_{00}$ and $T_{180}$ of the electron beam 3 are represented as follows, when the sample 5 is disposed at the wafer loading angles of 0° and 180°:

$T_0$=landing angle θ of the electron beam 3+inclination angle α of pyramid pattern 90, $T_{180}$=landing angle θ of the electron beam 3−inclination angle α of pyramid pattern 90, where α denotes inclination angle of the crystal orientation plane ((100) plane) with respect to the sample plane 5s, and θ denotes inclination angle of the electron beam 3 corresponding to a predetermined observation direction.

In this case, since the normal line of the sample plane 5s is in parallel with the optical axis direction of the electron optical system 20, the landing angle θ of the electron beam 3 with respect to the sample plane 5s, i.e., the absolute inclination angle of the electron beam 3 corresponding to the predetermined observation direction corresponding to this landing angle θ of the electron beam 3 can be found by averaging the landing angle $T_{00}$ of the electron beam 3 that is measured at the wafer loading angle 0° and the landing angle $T_{180}$ of the electron beam 3 that is measured at the wafer loading angle 180° as follows:

absolute inclination angle θ of electron beam=$(T_0+T_{180})/2$.

Thus the processor 50 of the present embodiment performs the following processing to suppress a measurement error in landing angle due to pattern inclination in order to find the absolute inclination angle θ only of the electron beam 3 corresponding to the predetermined observation direction corresponding to the landing angle θ of the electron beam 3.

During the processing to suppress a measurement error in landing angle due to scan distortion, the processor 50 firstly serves as a calibration pattern image acquisition unit to acquire an SEM image of the sample 5 having the pyramid pattern 90 formed therein that is disposed at the wafer loading angle 0° or 180° having the pyramid pattern 90 opposed. These SEM images may be acquired by loading the sample 5 on the stage 31 while changing the loading direction of the sample 5 between the opposed directions, or the direction of the stage 31 with the sample 5 loaded thereon as a whole may be reversed by the stage mechanism 32.

Then similarly to the aforementioned correction processing of landing angle of the electron beam 3, the processor 50 serves as the landing angle measurement unit of the electron beam 3 to measure the landing angles $T_{00}$ and $T_{180}$ of the electron beam 3 in the opposed disposition states of the wafer loading angles 0° and 180° based on a geometric deformation of the pyramid patterns 90 of the SEM images that are acquired in the disposition states at the opposed wafer loading angles 0° and 180°.

Then the processor 50 serves as a pattern inclination measurement error suppression unit to average these landing angles $T_{00}$ and $T_{180}$ of the electron beam 3, thus suppressing influences from the inclination angle α between the sample plane 5s and the crystal orientation plane ((100) plane) and so precisely measuring the landing angle of the electron beam 3 with respect to the sample plane 5s with the absolute inclination angle of the electron beam 3.

Embodiment of Processing to Suppress Measurement Error

The following describes an embodiment of the processing to suppress a measurement error in landing angle due to scan distortion and the processing to suppress a measurement error in landing angle due to pattern inclination as stated above in the scanning electron microscope 1 according to the present embodiment shown in FIG. 1, with reference to flowcharts.

Figure 5:
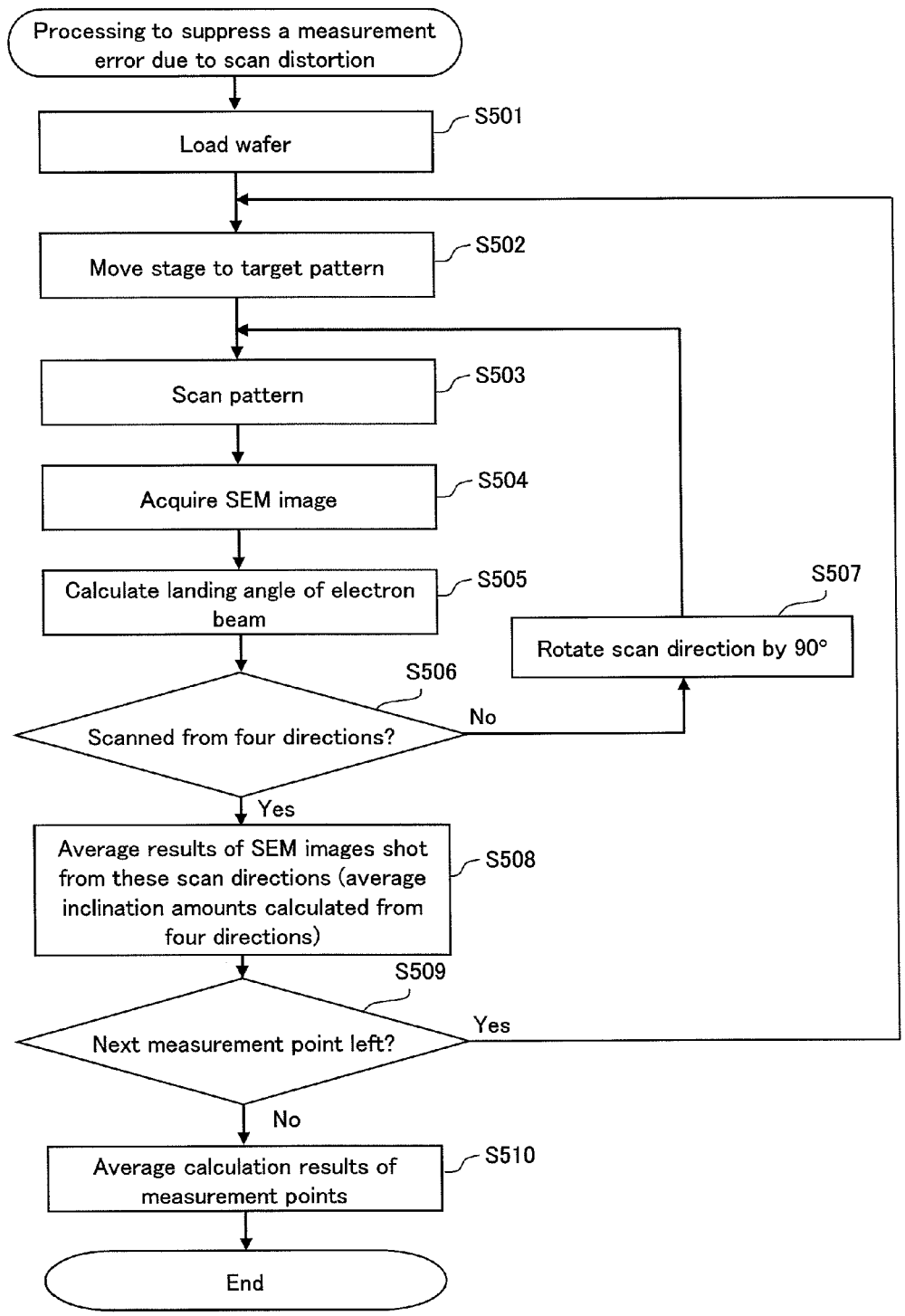
FIG. 5 is a flowchart of the processing to suppress a measurement error due to scan distortion.

FIG. 5 is a flowchart of the processing to suppress a measurement error in landing angle due to scan distortion that is performed by the scanning electron microscope.

In response to issuance of an instruction to start the processing to suppress a measurement error in landing angle due to scan distortion, the processor 50 loads a sample 5 having a sample plane with a pyramid pattern 90 formed therein in the sample chamber 30, and loads it on the stage 31 (S501). Then the processor 50 controls the stage mechanism 32 based on known sample data of the sample 5 to move the stage 31 so that a pyramid pattern 90 as a target of the sample 5 loaded on the stage 31 is positioned at the center of the image (S502). This positioning is performed by moving the stage 31 so that the bottom apex $P_0$ at the center of the pyramid pattern 90 as a target on the sample plane is located on the optical axis of the electron optical system 20.

When the pyramid pattern 90 as a target is disposed at the aforementioned predetermined position, then the processor

50 adjusts focus with the focusing lens 21 and the objective lens 22, sets the rotation angle RR of the raster rotation at 0° and scans the pyramid pattern 90 as a target with the electron beam 3 in an image shift manner by the deflector 23 (S503).

Then for the scanning with the electron beam 3, the processor 50 generates an SEM image 901(RR00) of the pyramid pattern 90 at the rotation angle RR of 0° (RR00) based on a detection signal supplied from the secondary electron detector 40 and acquires the same (S504).

When the SEM image 901(RR00) is acquired, then the processor 50 estimates landing angle of the electron beam 3 with respect to the sample plane of the sample 5 based on a geometric deformation of the pyramid pattern 90 on this SEM image 901(RR00) at the rotation angle RR of 0° (RR00), and stores it with the characteristics i(RR00) about a relationship between the image shift amount and the inclination angle of the electron beam at the thus estimated landing angle of the electron beam 3 (S505).

Then, the processor 50 checks whether all estimations of landing angle of the electron beam 3 in the predetermined opposed directions where the scanning directions are changed between mutually opposed directions, in this case at the rotation angle RR of 0° (RR00), 180° (RR180), 90° (RR90) and 270° (RR270) are completed or not (S506).

When this check shows that all estimations are not completed, the processor 50 sets the raster rotation so that the rotation angle RR is at a remaining rotation angle RR (S507), and performs the processing of Steps S503 to S506 repeatedly for each of the remaining rotation angles RR.

On the other hand, when the estimations of the landing angle of the electron beam 3 by raster rotation in normal and reverse two directions in the predetermined opposed directions are completed, the processor 50 averages the inclination angles estimated in these direction and the characteristics i(RR00), ii(RR180), iii(RR90), and iv(RR270) about relationships between the image shift amounts and the inclination angles of the electron beam at the estimated landing angles of the electron beam 3, thus finding the inclination angle of the electron beam 3 less influenced from scan distortion and the characteristics about a relationship between the image shift amount at the inclination angle of the electron beam 3 less influenced from scan distortion and the inclination angle of the electron beam (S508).

Specifically the processor 50 averages the landing angles of the electron beam 3 estimated at the rotation angles RR of the raster rotation at 0°, 180°, 90° and 270°. Similarly the processor 50 averages the characteristics i(RR00), ii(RR180), iii(RR90) and iv(RR270) as well about the relationships between the image shift amounts corresponding to the landing angles of the electron beam 3 estimated at the rotation angle RR of the raster rotation at 0°, 180°, 90° and 270° and the inclination angles of the electron beam.

Then the processor 50 corrects so that the inclination angle of the electron beam 3 corresponding to the landing angle of the electron beam 3 with respect to the sample 5 that is set when the observation position is set originally becomes the inclination angle of the electron beam corresponding to the thus averaged estimation landing angle, and corrects a scan signal so as to generate the inclination angle of the electron beam 3 corresponding to each image shift amount of the averaged characteristics to store them.

In this case, since it is disposed at the landing angle 0° at Step S502 so that the pyramid pattern 90 is located at the center of the image and the bottom apex $P_0$ of the center of the pyramid pattern 90 is located on the optical axis of the electron optical system 20, the landing angle 0° as the inclination angle of the electron beam 3 corresponding to the image center at the midst of the shift corresponds to the thus averaged estimation landing angle in the state where the electron beam 3 is not deflected intentionally by the deflector 23 and the electron beam 3 is deflected by the deflector 23 with a scan signal only for image shift.

Then the scan signal may be corrected so that the thus averaged estimation landing angle is set at the center position of the image shift and the scan signal reflects the inclination angle of the electron beam 3 corresponding to each image shift amount of the average characteristics of the characteristics indicated with RR00, RR180, RR90 and RR270 shown in FIG. 3, whereby influences from scan distortion on the scan signal can be suppressed.

Then the processor 50 of the present embodiment determines, based on known sample data on the sample 5, whether there is another measurement point where the pyramid pattern 90 to be observed is formed on the sample plane of the sample 5 for further precise suppression of influences from scan distortion (S509).

Then when there is another measurement point, the processor 50 performs the processing of Steps S502 to S509 for such a measurement point repeatedly. On the other hand, when the processing of Steps S502 to S509 is performed for all of the pyramid patterns 90 at the measurement points on the sample plane of the sample 5, then the processor 50 averages the inclination angles of the electron beam 3 and the scan signals that are stored for the measurement points to improve the accuracy of the inclination angle of the electron beam 3 less influenced from scan distortion and the scan signal (S510).

Figure 6:
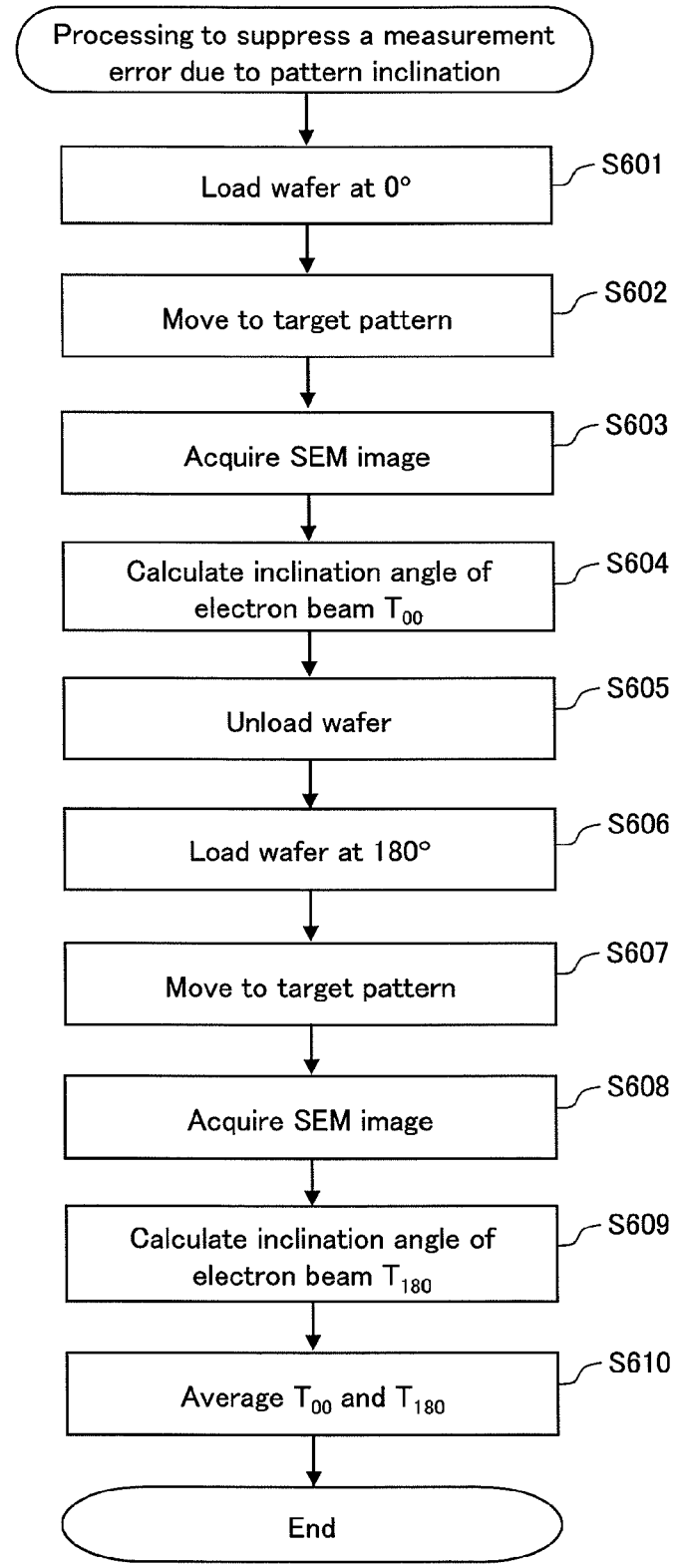
FIG. 6 is a flowchart of the processing to suppress a measurement error in landing angle due to pattern inclination.

FIG. 6 is a flowchart of the processing to suppress a measurement error in landing angle due to pattern inclination that is performed by the scanning electron microscope.

In response to issuance of an instruction to start the processing to suppress a measurement error in landing angle due to pattern inclination, the processor 50 loads a sample 5 having a sample plane with a pyramid pattern 90 formed therein in the sample chamber 30 while setting the wafer loading angle at 0°, and loads it on the stage 31 (S601). Then the processor 50 controls the stage mechanism 32 based on known sample data of the sample 5 to move the stage 31 so that a pyramid pattern 90 as a target of the sample 5 loaded on the stage 31 is positioned at the center of the image (S602). This positioning is performed by moving the stage 31 so that the bottom apex $P_0$ at the center of the pyramid pattern 90 as a target on the sample plane is located on the optical axis of the electron optical system 20.

When the pyramid pattern 90 as a target is disposed at the aforementioned predetermined position, then the processor 50 adjusts focus with the focusing lens 21 and the objective lens 22, fixes the rotation angle RR of the raster rotation to a predetermined angle and scans the pyramid pattern 90 as a target with the electron beam 3 in an image shift manner by the deflector 23. Then for the scanning with the electron beam 3, the processor 50 generates an SEM image of the pyramid pattern 90 that is disposed at the wafer loading angle of 0° based on a detection signal supplied from the secondary electron detector 40 and acquires the same (S603).

Similarly to the aforementioned correction processing of landing angle of the electron beam 3, the processor 50 serves as the landing angle measurement unit of the electron beam 3 to measure the landing angle $T_{00}$ of the electron beam 3 that is disposed at the wafer loading angle of 0° based on a geometric deformation of the pyramid patterns 90 on the SEM images that is acquired in the disposition state at the wafer loading angle of 0° (S604).

Then the processor 50 of the present embodiment unloads the sample 5 once from the sample chamber 30 (S605), sets the wafer loading angle at 180° by reversing the loading direction of the sample 5, and then loads the sample 5 again in the sample chamber 30 and loads it on the stage 31 (S606).

The processor 50 controls the stage mechanism 32 based on known sample data of the sample 5 to move the stage 31 so that the same pyramid pattern 90 as that is used before for the measurement of the landing angle $T_{00}$ of the electron beam 3 is positioned at the center of the image (S607).

Then the processor 50 generates an SEM image of the pyramid pattern 90 that is disposed at the wafer loading angle of 180° and acquires it (S608) and measures the landing angle $T_{180}$ of the electron beam 3 in the disposition state of the wafer loading angle of 180° and stores it (S609).

Then the processor 50 averages the estimated landing angle $T_{00}$ of the electron beam 3 for lading of the wafer at 0° and the estimated landing angle $T_{180}$ of the electron beam 3 for landing of the wafer at 180°, thus finding the inclination angle θ of the electron beam 3, from which the inclination angle α of the pyramid pattern 90 with respect to the sample plane of the sample 5 has been cancelled (S610). Then the processor 50 uses the thus stored inclination angle θ of the electron beam 3 to suppress influences from the inclination angle α between the sample plane 5s and the crystal orientation plane ((100) plane), thus enabling precise measurement of the landing angle of the electron beam 3 with respect to the sample plane 5s with the absolute inclination angle of the electron beam 3.

This allows all of the pyramid patterns 90 to have the same inclination amount as long as they are within the wafer cut at once, and so the processor 50 may measure the inclination amount a of the pyramid pattern 90 for the sample plane once and records it, whereby such an inclination angle of the pyramid pattern 90 can be cancelled and so absolute angle can be measured.

Next the following describes maintenance processing of the scanning electron microscope 1 equipped with such a measurement error suppression function.

The inclination angle of the electron beam 3 may vary with the operation state of the scanning electron microscope 1 day by day. This may change greatly especially when maintenance is performed, such as replacement of a chip of the electron gun 10 or a movable aperture.

The processing to suppress a measurement error in landing angle due to scan distortion shown in FIG. 5 can suppress influences from the scan distortion. The processing to suppress a measurement error in landing angle due to pattern inclination shown in FIG. 6 can cancel the inclination of the sample plane itself that is formed on a polyhedral structure having a known shape as a calibration pattern, and so the landing angle of a charged particle beam with respect to the sample plane can be measured accurately with the absolute inclination angle of the charged particle beam. To perform these methods together can suppress the measurement error due to scan distortion and can cancel the inclination of the pyramid pattern, whereby the absolute angle of the electron beam can be measured.

Figure 7:
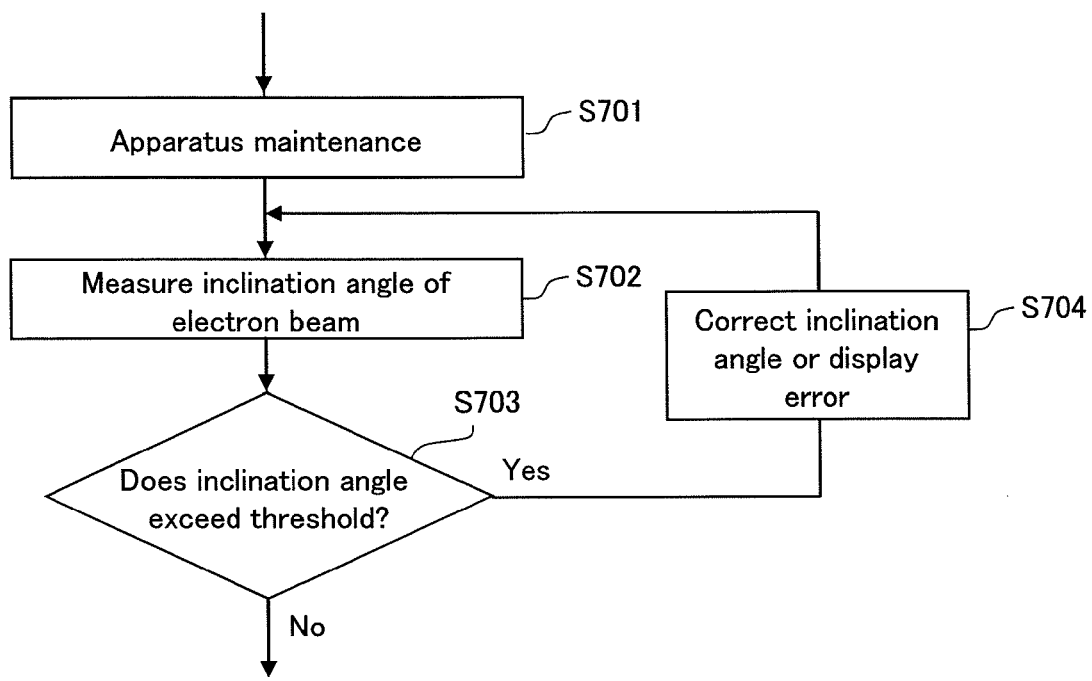
FIG. 7 is a flowchart showing one embodiment of maintenance correction processing.

FIG. 7 shows one embodiment of the maintenance correction processing that is performed for the scanning electron microscope 1.

When maintenance of the apparatus such as replacement of a chip of the electron gun 10 or replacement of a movable aperture is performed for the scanning electron microscope 1 (S701), the processor 50 subsequently executes the processing to suppress a measurement error in landing angle due to scan distortion shown in FIG. 5 (S702). Then the processor 50 determines whether the average value of the landing angles of the electron beam 3 with respect to the pyramid pattern 90 of the sample 5 that are estimated at the rotation angles RR of raster rotation at 0°, 180°, 90° and 270° or the average value of them for the measurement points where the pyramid patterns 90 on the sample plane of the sample 5 are formed exceeds a predetermined threshold or not (S703).

When the result shows that it exceeds the predetermined threshold, the processor 50 corrects the inclination angle of the electron beam 3 less influenced from scan distortion and the scan signal, and displays an error on the GUI screen displayed on the display 61 of the input/output device 60 (S704), and performs the processing to check whether the processing to suppress a measurement error in landing angle due to scan distortion at Step S702 and the processing to suppress a measurement error at Step S703 end or not until the average value falls below the predetermined threshold.

Herein the sample 5 that is used beforehand for the processing to suppress a measurement error in landing angle due to scan distortion is subjected to the processing to suppress a measurement error in landing angle due to pattern inclination shown in FIG. 6. Such a sample 5 that is subjected to the processing to suppress a measurement error in landing angle due to pattern inclination so as to calibrate a shift between the sample plane (wafer plane) and the crystal orientation plane beforehand can shorten the measurement duration.

As a result, the absolute inclination angle of the electron beam on the absolute coordinate system can be calculated, and so beam inclination correction or the like can be performed for each apparatus using these measurement results, whereby a difference in dimensions measured among apparatuses can be reduced. At this time, there is no need to use the same sample 5 having the pyramid pattern 90 formed therein for these apparatuses, but monitoring on a shift between the sample plane (wafer plane) of the sample 5 having the pyramid pattern 90 formed therein and its crystal orientation plane that is used for the calibration of each device may be performed, whereby the same inclination angle can be kept for all of the apparatuses, and so an instrumental error that is a difference in dimension measured among apparatuses due to beam inclination can be reduced. As a result, there is no need to use a same sample such as a golden wafer to measure in the apparatuses, and absolute inclination angle can be measured precisely using any sample.

Figure 8:
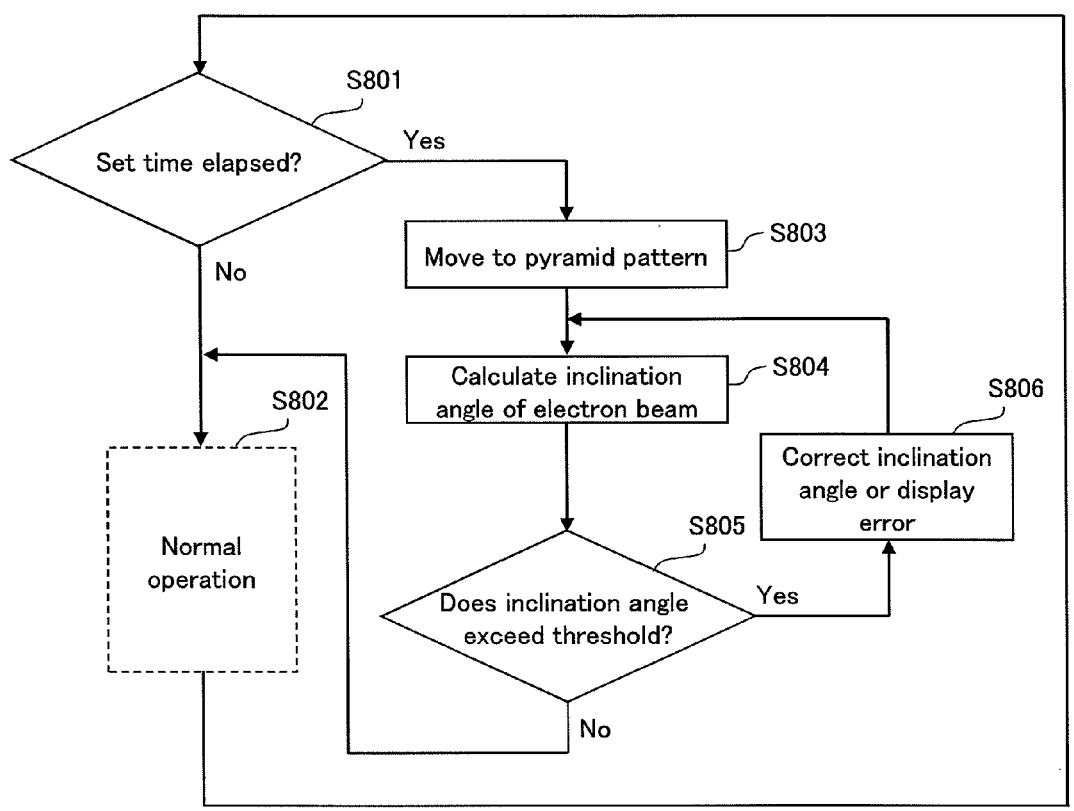
FIG. 8 is a flowchart showing another embodiment of maintenance correction processing.

Next, the following describes another embodiment of the maintenance correction processing that is performed for the scanning electron microscope 1, with reference to FIG. 8.

FIG. 8 shows another embodiment of the maintenance correction processing that is performed for the scanning electron microscope 1.

The present embodiment monitors the inclination angle of the electron beam 3 at the scanning electron microscope 1 at regular intervals, and so can manage the inclination of electron beams that is generated due to a variation of the apparatus or disturbance in real time. A sample 5, which is subjected to the processing to suppress a measurement error in landing angle due to pattern inclination shown in FIG. 6 so as to calibrate a shift between the sample plane (wafer plane) and the crystal orientation plane beforehand, may be disposed on the stage 31 as a stub sample, thus enabling automatic measurement in a short time.

In FIG. 8, the processor 50 measures a maintenance period time that is set beforehand based on a timer equipped as time-measurement means during the normal operation as the scanning electron microscope 1 (S802), and checks whether the measurement value of this maintenance period time exceeds the predetermined maintenance time or not (S801).

When it does not exceed the maintenance period time yet, the processor 50 continues the normal operation processing. On the other hand, when it exceeds the maintenance time, the processor 50 stops the normal operation processing, and automatically moves the stage 31 so that the irradiation position with the electron beam 3 and the observation view are brought from the sample as an observation or measurement target loaded on the stage 31 to the pyramid pattern 90 of the stub sample disposed on the stage 31 (S803).

Then the processor 50 executes the processing to suppress a measurement error in landing angle due to scan distortion shown in FIG. 5 for this pyramid pattern 90 (S804). Then the processor 50 determines whether the average value of the landing angles of the electron beam 3 with respect to the pyramid pattern 90 of the sample 5 that are estimated at the rotation angles RR of raster rotation at 0°, 180°, 90° and 270° or the average value of them for the measurement points where the pyramid patterns 90 on the sample plane of the sample 5 are formed exceeds a predetermined threshold or not (S805).

When the result shows that it exceeds the predetermined threshold, the processor 50 corrects the inclination angle of the electron beam 3 less influenced from scan distortion and the scan signal, and displays an error on the GUI screen displayed on the display 61 of the input/output device 60 (S806), and performs the processing to check whether the processing to suppress a measurement error in landing angle due to scan distortion at Step S804 and the processing to suppress a measurement error at Step S805 end or not until the average value falls below the predetermined threshold.

Then when the average value falls below the predetermined threshold, the processor 50 resets the measurement value of the maintenance period time, and then returns the irradiation position with the electron beam 3 and the observation view to the sample as an observation or measurement target loaded on the stage 31 and continues the normal operation as the scanning electron microscope 1.

Herein the sample 5 that is used beforehand for the processing to suppress a measurement error in landing angle due to scan distortion is subjected to the processing to suppress a measurement error in landing angle due to pattern inclination shown in FIG. 6. Such a sample 5 that is subjected to the processing to suppress a measurement error in landing angle due to pattern inclination so as to calibrate a shift between the sample plane (wafer plane) and the crystal orientation plane beforehand can shorten the measurement duration.

Such monitoring of the inclination angle of the electron beam 3 at predetermined periodic time intervals allows the inclination of electron beams that is generated due to a variation of the apparatus or disturbance to be managed in real time. Since a stub sample is disposed on the stage, there is no need to replace a sample as an observation or measurement target, so that the measurement duration can be shortened.

That is a detailed description on one embodiment of a charged particle beam apparatus and a method of correcting a landing angle of a charged particle beam according to the present invention, and specific forms of the configuration of each part and specific procedure can be variously modified to other examples other than the aforementioned embodiment. For instance, for the description of the maintenance correction processing, the sample 5 that is used beforehand for the processing to suppress a measurement error in landing angle due to scan distortion is subjected to the processing to suppress a measurement error in landing angle due to pattern inclination shown in FIG. 6. The latter processing may be performed together with the processing to suppress a measurement error in landing angle due to scan distortion. Only one of the processing to suppress a measurement error in landing angle due to scan distortion and the processing to suppress a measurement error in landing angle due to pattern inclination may be performed, by which accuracy of the processing to correct a landing angle of the electron beam 3 can be improved.

REFERENCE SIGNS LIST

1 Scanning electron microscope
2 Casing
3 Electron beam
5 Sample
10 Electron gun
20 Electron optical system
21 Focusing lens
22 Objective lens
23 Deflector
30 Sample chamber
31 Stage
32 Stage mechanism
40 Secondary electron detector
50 Processor All publications, patents, and patent applications cited herein are incorporated herein by reference in their entirety.

The invention claimed is:

1. A charged particle beam apparatus, comprising:
   an image acquisition unit configured to:
      acquire at least a first charged particle beam image by scanning a polyhedral structure having a known shape, which is formed on a sample plane, in a first scanning direction using a charged particle beam,
      change a scanning direction of the charged particle beam or a loading direction of a sample in which the polyhedral structure is disposed so that a scan line direction of the charged particle beam with respect to the polyhedral structure changes, and
      acquire at least a second charged particle beam image by scanning the polyhedral structure in a second scanning direction, oriented 180° with respect to the first scanning direction, using the charged particle beam; and
   a landing angle measurement unit configured to:
      measure a landing angle of the charged particle beam for each of the acquired charged particle beam images based on a geometric deformation of the polyhedral structure in the respective image, and
      average the landing angles of the charged particle beam for the first and second scanning directions.

2. The charged particle beam apparatus according to claim 1, wherein the image acquisition unit changes a rotation angle between 0°, 180°, 90° and 270° by raster rotation to provide opposite scanning directions, and acquires a charged particle beam image of the polyhedral structure corresponding to each rotation angle in an image shift manner.

3. The charged particle beam apparatus according to claim 1, wherein the image acquisition unit changes a wafer loading angle of the sample between 0° and 180° to provide opposite loading directions, and acquires a charged particle beam image of the polyhedral structure corresponding to each wafer loading angle in an image shift manner.

4. The charged particle beam apparatus according to claim 2, wherein a measurement error suppression unit is configured to average the landing angles of the charged particle beam for the first and second scanning directions for the landing angle measurement unit.

5. A method of correcting landing angle, comprising the steps of:
acquiring at least a first charged particle beam image by scanning a polyhedral structure having a known shape, which is formed on a sample plane, in a first scanning direction using a charged particle beam;
changing a scanning direction of the charged particle beam or a loading direction of a sample in which the polyhedral structure is disposed so that a scan line direction of the charged particle beam with respect to the polyhedral structure changes;
acquiring at least a second charged particle beam image by scanning the polyhedral structure in a second scanning direction, oriented 180° with respect to the first scanning direction, using the charged particle beam;
measuring a landing angle of the charged particle beam for each of the acquired charged particle beam images based on a geometric deformation of the polyhedral structure in the respective image; and
averaging the landing angles of the charged particle beam for the first and second scanning directions.

6. The charged particle beam apparatus according to claim 1, wherein each scanning direction is in a plane parallel to the sample plane.

7. The method according to claim 5, wherein each scanning direction is in a plane parallel to the sample plane.

8. A charged particle beam apparatus, comprising:
an image acquisition unit configured to, in order to acquire a first image by two-dimensionally scanning a polyhedral structure having a known shape, which is formed on a sample plane, by sequentially moving a position of a scanning line, which is formed by moving a charged particle beam irradiation position in at least a first direction, in a third direction that is orthogonal to the first direction, and in order to acquire a second image by two-dimensionally scanning the polyhedral structure by sequentially moving a position of a scanning line, which is formed by moving a charged particle beam irradiation position in a second direction that is opposite to the first direction, in a fourth direction that is opposite to the third direction, change a scanning direction of the charged particle beam or a loading direction of a sample in which the polyhedral structure is disposed so that a scan line direction of the charged particle beam with respect to the polyhedral structure changes, thereby acquiring the images; and
a landing angle measurement unit configured to, for the plurality of images of different scanning directions acquired by the image acquisition unit, measure landing angles of a plurality of charged particle beams for the respective scanning directions from the plurality of images of different scanning directions based on a geometric deformation of the polyhedral structure in the respective images, and average the landing angles of the charged particle beams for the respective scanning directions.

9. The charged particle beam apparatus according to claim 8, wherein the image acquisition unit changes a rotation angle between 0°, 180°, 90° and 270° by raster rotation to provide opposite scanning directions, and acquires a charged particle beam image of the polyhedral structure corresponding to each rotation angle in an image shift manner.

10. The charged particle beam apparatus according to claim 8, wherein the image acquisition unit changes a wafer loading angle of the sample between 0° and 180° to provide opposite loading directions, and acquires a charged particle beam image of the polyhedral structure corresponding to each wafer loading angle in an image shift manner.

11. The charged particle beam apparatus according to claim 9, wherein a measurement error suppression unit is configured to average the landing angles of the charged particle beam for the first and second scanning directions for the landing angle measurement unit.

12. The charged particle beam apparatus according to claim 8, wherein each scanning direction is in a plane parallel to the sample plane.

* * * * *